(12) United States Patent
Boyd, Jr. et al.

(10) Patent No.: US 10,654,147 B2
(45) Date of Patent: May 19, 2020

(54) POLISHING OF ELECTROSTATIC SUBSTRATE SUPPORT GEOMETRIES

(71) Applicant: Applied Materials, Inc., Santa Clara, CA (US)

(72) Inventors: Wendell Glenn Boyd, Jr., Morgan Hill, CA (US); Jim Zhongyi He, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 247 days.

(21) Appl. No.: 15/886,574

(22) Filed: Feb. 1, 2018

(65) Prior Publication Data
US 2019/0111541 A1    Apr. 18, 2019

Related U.S. Application Data

(60) Provisional application No. 62/573,491, filed on Oct. 17, 2017.

(51) Int. Cl.
| | |
|---|---|
| *B24B 37/14* | (2012.01) |
| *B24B 37/04* | (2012.01) |
| *B24B 37/10* | (2012.01) |
| *H01L 21/683* | (2006.01) |
| *H01L 21/687* | (2006.01) |

(Continued)

(52) U.S. Cl.
CPC .......... *B24B 37/14* (2013.01); *B24B 37/044* (2013.01); *B24B 37/105* (2013.01); *H01L 21/6831* (2013.01); *H01L 21/6875* (2013.01); *H01L 21/68757* (2013.01); *C23C 16/513* (2013.01); *H01J 37/32715* (2013.01); *H01J 2237/3321* (2013.01)

(58) Field of Classification Search
CPC ..... B24B 37/14; B24B 37/044; B24B 37/105; H01L 21/6831; H01L 21/6875; H01L 21/687577; C23C 16/513; H01J 37/32715; H01J 37/3321
See application file for complete search history.

(56) References Cited

U.S. PATENT DOCUMENTS 7,589,950 B2 * 9/2009 Parkhe ............... H01L 21/6831
                                                       279/128
8,226,769 B2   7/2012 Matyushkin et al.
(Continued)

FOREIGN PATENT DOCUMENTS

JP    H07221168 A    8/1995
KR    20010063395 A   7/2001
(Continued)

OTHER PUBLICATIONS

PCT International Search Report and Written Opinion dated Nov. 2, 2018, for International Application No. PCT/US2018/042387.

*Primary Examiner* — Dung Van Nguyen
(74) *Attorney, Agent, or Firm* — Patterson + Sheridan LLP (57) ABSTRACT

Methods of polishing a patterned surface of an electrostatic chucking (ESC) substrate support to be used in plasma assisted or plasma enhanced semiconductor manufacturing chambers are provided herein. In particular, embodiments described herein, provide polishing methods that round and debur the edges of elevated features and remove dielectric material from the non-substrate contacting surfaces of a patterned substrate support to reduce defectivity associated therewith.

17 Claims, 6 Drawing Sheets

(51) Int. Cl.
*C23C 16/513* (2006.01)
*H01J 37/32* (2006.01)

(56) References Cited

U.S. PATENT DOCUMENTS

| | | |
|---|---|---|
| 9,001,489 B2 | 4/2015 | Boyd, Jr. et al. |
| 9,358,702 B2 | 6/2016 | Banda et al. |
| 2004/0055709 A1 | 3/2004 | Boyd, Jr. et al. |
| 2006/0002053 A1* | 1/2006 | Brown ................ H01L 21/6831 361/234 |
| 2009/0284894 A1* | 11/2009 | Cooke ................ H01L 21/6875 361/234 |
| 2012/0307412 A1 | 12/2012 | Boyd, Jr. et al. |
| 2014/0151332 A1* | 6/2014 | Fukasawa ........... H01L 21/6875 216/67 |
| 2014/0263176 A1 | 9/2014 | Parkhe et al. |
| 2015/0044947 A1 | 2/2015 | Lu et al. |
| 2017/0140970 A1 | 5/2017 | Boyd, Jr. et al. |
| 2018/0204747 A1* | 7/2018 | Knyazik ........... H01L 21/67109 |
| 2019/0080951 A1* | 3/2019 | Huston ............... H01L 21/6835 |

FOREIGN PATENT DOCUMENTS

| | | |
|---|---|---|
| KR | 101226570 B1 | 1/2013 |
| KR | 20160042061 A | 4/2016 |

\* cited by examiner

POLISHING OF ELECTROSTATIC SUBSTRATE SUPPORT GEOMETRIES

CROSS REFERENCE TO RELATED APPLICATIONS

This application claims priority to United States Provisional Application Ser. No. 62/573,491, filed on Oct. 17, 2017, which is herein incorporated by reference in its entirety.

BACKGROUND

Field

Embodiments described herein generally relate to the manufacturing of articles used in semiconductor manufacturing processes, in particular, to methods of manufacturing an electrostatic chuck (ESC) substrate support for use in a processing chamber.

Description of the Related Art

Electrostatic chuck (ESC) substrate supports are commonly used in semiconductor manufacturing to securely hold a substrate in a processing position, within a processing volume of a processing chamber, by means of an electrostatic chucking (ESC) force. The chucking force is a function of the potential between a voltage provided to a chucking electrode embedded in a dielectric material of the substrate support and a substrate disposed on a surface of the dielectric material.

Often, the substrate support is used to maintain the substrate at a desired temperature, or within a desired range of temperatures, by heat transfer between the dielectric material of the substrate support and the substrate disposed thereon. For example, some substrate supports include a heating element, embedded in the dielectric material thereof, that is used to heat the substrate support, and thereby the substrate, to a desired temperature before processing and/or to maintain the substrate at a desired temperature during processing. For other semiconductor manufacturing processes, it is desirable to cool the substrate during the processing thereof and the substrate support is thermally coupled to a cooling base, typically comprising one or more cooling channels having a cooling fluid flowing therethrough. In some cases, the substrate support includes both heating elements and cooling channels, whereby control of the substrate support temperature can be finely controlled.

Typically, a low pressure atmosphere in a processing volume of a processing chamber results in poor thermal conduction between the dielectric material of the substrate support and the substrate, thereby reducing the substrate support's effectiveness in heating or cooling the substrate. Therefore, in some processes, a thermally conductive inert gas, typically helium, is introduced into a backside volume disposed between the non-device side surface of the substrate and the substrate support to improve the heat transfer therebetween. The backside volume is defined by one or more recessed surfaces of the substrate support, one or more elevated features extending from the one or more recessed surfaces, and the non-device side surface of a substrate disposed on the surfaces of one or more elevated features. Typically, the elevated features of the substrate support include one or more outer sealing bands, concentrically disposed on the substrate support, and the plurality of protrusions extending from the recessed surface(s) space the substrate from the one or more recessed surfaces of the substrate support. In some embodiments, the elevated features further include a plurality of interior sealing bands, each of which is concentrically disposed about a respective lift pin opening formed in the dielectric material of the substrate support.

The contact between the substrate and the elevated features of the patterned surface frequently causes undesirable scratches on or in the non-device side surface of the substrate and undesirable wear of the substrate support at the respective contacting surfaces therebetween. Typically, the scratches on the non-device side surface of the substrate and/or wear of the dielectric material of the substrate support are particularly pronounced at the edges of each of their respective substrate contacting surfaces. Particulate materials produced from the scratches and/or wear of the substrate support eventually transfer from the substrate support and/or the non-device side surface of the substrate to the device side surface of the substrate and/or other substrates through subsequent handling and/or processing operations thereby ultimately suppressing device yield from a substrate.

Accordingly, what is needed in the art are improved methods of manufacturing substrate supports to reduce undesirable scratching of the non-device side surface of a substrate and undesirable wear of the substrate support at the substrate contacting surface thereof.

SUMMARY

Embodiments described herein generally relate to the manufacturing of articles used in semiconductor manufacturing processes, in particular, to methods of manufacturing an electrostatic chuck (ESC) substrate support for use in a processing chamber during plasma assisted or plasma enhanced semiconductor processes.

In one embodiment, a method of polishing a substrate support is provided. The method includes rotating a polishing platen having a polishing pad mounted thereon, applying a polishing fluid to the polishing pad, urging a patterned surface of the substrate support against the polishing pad with a polishing downforce, and polishing the patterned surface of the substrate support. Polishing the patterned surface of the substrate support includes removing a first thickness of material from a plurality of protrusions at a substrate facing surfaces thereof and removing a second thickness of material from one or more sides of the plurality of protrusions, wherein the second thickness is the same or more than about the first thickness.

Herein, the patterned surface of the substrate support comprises a plurality of protrusions extending from one or more recessed surfaces and a substrate contacting surface area of the patterned surface is less than about 20% of a non-device side surface area of a substrate to be disposed on the substrate support.

In another embodiment, a method of polishing a patterned surface of a substrate support is provided. The method includes rotating a polishing platen having a polishing pad mounted thereon and applying a polishing fluid to the polishing pad. Herein the polishing fluid comprises diamond abrasives that have an average diameter of less than about 10 µm. The method further includes urging the patterned surface of the substrate support against the polishing pad with a polishing downforce. Herein, the patterned surface of the substrate support comprises a plurality of elevated features extending from one or more recessed surfaces thereof, where the substrate contacting surface area of the elevated features is less than about 20% of a non-device side surface area of a substrate to be disposed on the substrate support. The method further includes polishing the patterned surface of the substrate support to remove more than about 0.5 µm of material from the substrate contacting surfaces of the elevated features.

In another embodiment, a method of polishing a patterned surface of a substrate support is provided. The method includes rotating a polishing platen having a polishing pad mounted thereon and applying a polishing fluid to the polishing pad. Herein the polishing fluid comprises diamond abrasives having an average diameter of less than about 10 µm. The method further includes urging the patterned surface of the substrate support against the polishing pad with a polishing downforce. Herein the patterned surface of the substrate support comprises a plurality of cylindrically shaped protrusions extending from one or more recessed surfaces thereof where the surface area of the upper surfaces of the plurality of protrusions is less than about 20% of a non-device side surface area of a substrate to be disposed on the substrate support. Herein, the plurality of cylindrical shaped protrusions have a mean diameter of between 500 µm and about 5 mm and the patterned surface is formed of a dielectric material selected from the group consisting of aluminum oxide ($Al_2O_3$), aluminum nitride (AlN), titanium oxide (TiO), titanium nitride (TiN), yttrium oxide ($Y_2O_3$), and combinations thereof. The method further includes polishing the patterned surface of the substrate support to remove more than about 0.5 µm of dielectric material from the upper surfaces and sides of each of the plurality of cylindrically shaped protrusions and more than about 0.1 µm of dielectric material from the one or more recessed surfaces.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to the manufacturing of articles used in semiconductor manufacturing processes, in particular, to methods of manufacturing an electrostatic chuck (ESC) substrate support for use in a processing chamber to hold and secure a substrate thereto during processing thereof.

Conventionally, the patterned surface of an ESC substrate support is formed using a negative masking/bead blasting processes, wherein the surface of the substrate support is bead blasted through openings in a patterned mask. The elevated features produced by the bead blasting process typically have pronounced sharp edges that require rounding and/or deburring prior to installing the substrate support in a processing chamber. Conventional methods of rounding and deburring these edges on high contact area (with the substrate) substrate supports do not remove, or do not remove sufficient, material from the non-substrate contacting surfaces of the substrate support to minimize the scratches, wear, and particulate transfer associated with low contact area (with the substrate) substrate supports. Embodiments described herein, provide polishing methods that round and debur the edges of elevated features and remove dielectric material from the non-substrate contacting surfaces of a patterned substrate support to reduce defectivity associated therewith.

Figure 1:
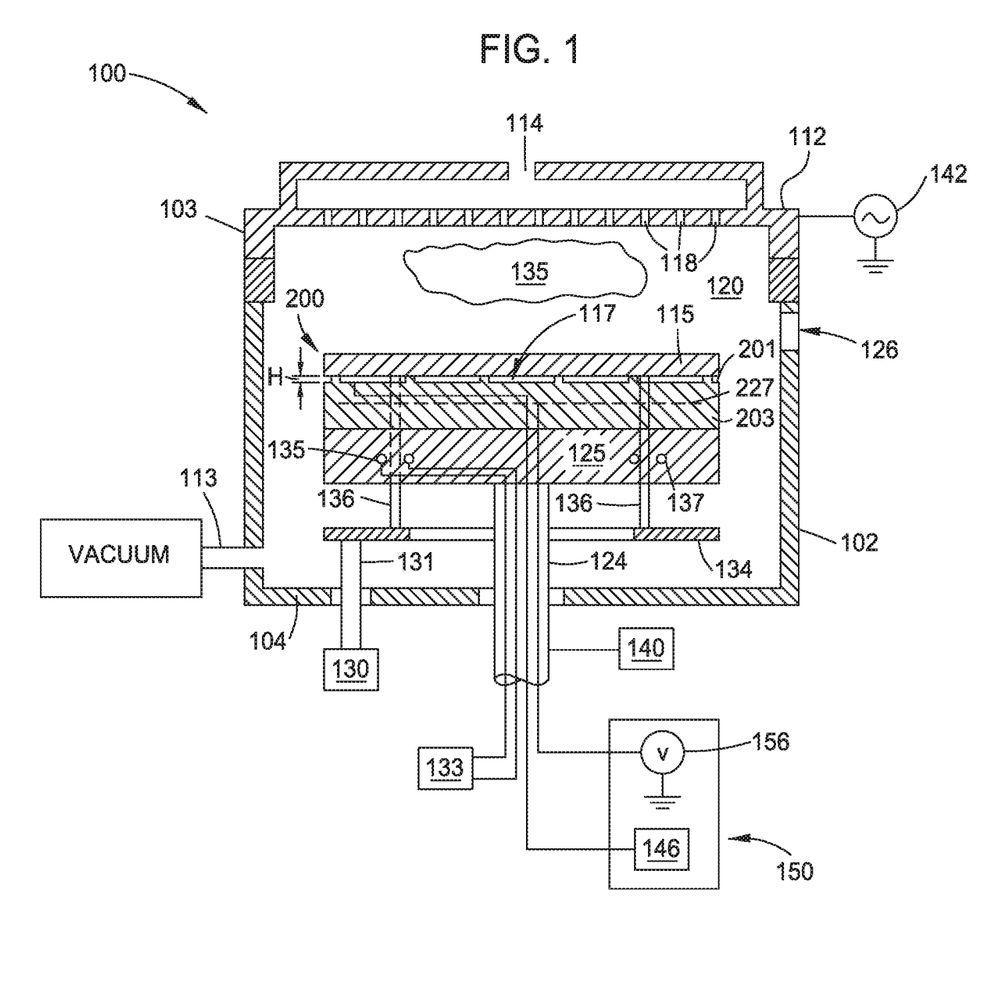
FIG. 1 is a schematic sectional view of a processing chamber with a substrate support disposed therein, where the substrate support is formed according to embodiments described herein.

FIG. 1 is a schematic sectional view of a processing chamber with a substrate support disposed therein, where the substrate support is formed according to embodiments described herein. Here, the processing chamber 100 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, a plasma treatment chamber, or a plasma based ion implant chamber, for example a plasma doping (PLAD) chamber. However, the substrate supports described herein can be used with any processing chamber or processing system that uses substrate supports having a patterned surface that includes elevated features and recessed surfaces.

Herein, the processing chamber 100 described is a schematic representation of a CVD processing chamber, and it includes a chamber lid 103, one or more sidewalls 102, and a chamber bottom 104 which define a processing volume 120. A gas distributer 112 commonly referred to as a showerhead, having a plurality of openings 118 disposed therethrough, is disposed in the chamber lid 103 and is used to uniformly distribute processing gases from a gas inlet 114 into the processing volume 120. The gas distributer 112 is coupled to a first power supply 142, such as an RF or VHF power supply, which supplies the power to ignite and maintain a processing plasma 135 composed of the processing gases through capacitive coupling therewith. The processing volume 120 is fluidly coupled to a chamber exhaust, such as to one or more dedicated vacuum pumps, through a vacuum outlet 113 which maintains the processing volume 120 at sub-atmospheric conditions and evacuates processing and other gases therefrom. A substrate support assembly 200, disposed in the processing volume 120 is disposed on a support shaft 124 sealingly extending through the chamber bottom 104. A first controller 140 controls a lift, such as a linear motor, stepper motor and gears, or other mechanism, to control raising and lowering of the support shaft 124, and the substrate support assembly 200 disposed thereon, to facilitate placement of, and removal of, the substrate 115 with respect to the processing volume 120 of the processing chamber 100.

The substrate 115 is loaded into, and removed from, the processing volume 120 through an opening 126 in one of the one or more sidewalls 102, which is conventionally sealed with a door or a valve (not shown) during substrate 115 processing. A plurality of lift pins 136 disposed above, but engageable with, a lift pin hoop 134 are movably disposed through the substrate support assembly 200 to facilitate transferring of the substrate 115 thereto and therefrom. The lift pin hoop 134 is coupled to a lift hoop shaft 131 sealingly extending through the chamber bottom 104, which raises and lowers the lift pin hoop 134 by means of an actuator 130. When the lift pin hoop 134 is in a raised position, the plurality of lift pins 136 are contacted from below and moved to extend above a patterned surface 201 of the substrate support 203 lifting the substrate 115 therefrom and enabling access to the substrate 115 by a robot handler. When the lift pin hoop 134 is in a lowered position the tops of the plurality of lift pins 136 are flush with, or below, the patterned surface 201 and the substrate rests on the elevated features thereof.

Typically, the substrate support assembly 200 includes a cooling base 125 and a substrate support 203 thermally coupled to, and disposed on, the cooling base 125. The cooling base 125 is used to regulate the temperature of the substrate support 203, and the substrate 115 disposed on the substrate support 203, during processing. The cooling base 125 herein includes one or more fluid conduits 137 disposed therein that are fluidly coupled to, and in fluid communication with, a coolant source 133, such as a refrigerant source or water source. Typically, the cooling base 125 is formed of a corrosion resistant thermally conductive material, such as a corrosion resistant metal, for example aluminum, an aluminum alloy, or stainless steel, and is thermally coupled to the substrate support 203 with an adhesive or by mechanical means.

Herein, the substrate support 203 is formed from a dielectric material, such as a bulk sintered ceramic material, such as silicon carbide (SiC) or a metal oxide or metal nitride ceramic material, for example aluminum oxide ($Al_2O_3$), aluminum nitride (AlN), titanium oxide (TiO), titanium nitride (TiN), yttrium oxide ($Y_2O_3$), mixtures thereof, and combinations thereof. Typically, the substrate support 203 includes a chucking electrode 227 embedded in the dielectric material thereof which secures the substrate 115 to the substrate support 203 by providing a potential between the substrate 115 and the chucking electrode 227. The potential between the substrate 115 and the chucking electrode 227 result in an electrostatic chucking (ESC) force therebetween. The chucking electrode 227 herein is electrically coupled to a second power supply 156, such as a DC power supply, which provides a chucking voltage thereto between about −5000 V and about +5000. An inert thermally conductive gas, typically helium, is provided to a backside volume 117 disposed between recessed surfaces of the substrate support 203 and a non-device side surface of a substrate 115 disposed thereon. Typically, the inert thermally conductive gas is provided to the backside volume 117 through a plurality of gas ports 223 (shown in FIGS. 2A-2B) formed in the substrate support 203 and in fluid communication with a backside gas supply 146. The thermally conductive inert gas thermally couples the substrate 115 to the substrate support 203 and increases the heat transfer therebetween. Herein, a second controller 150 is used to maintain the gas pressure in the backside volume 117 between about 1 Torr and about 100 Torr, such as between about 1 Torr and about 20 Torr, during plasma processing of the substrate 115. In some embodiments, the substrate support assembly 200 further includes one or more sensors (not shown) that measure the deflection of the substrate 115 when a chucking force is applied thereto. The deflection of the substrate 115 is communicated to the second controller 150 which determines the chucking force on the substrate 115 and adjusts the chucking voltage provided to the chucking electrode 227 accordingly.

Figure 2A:
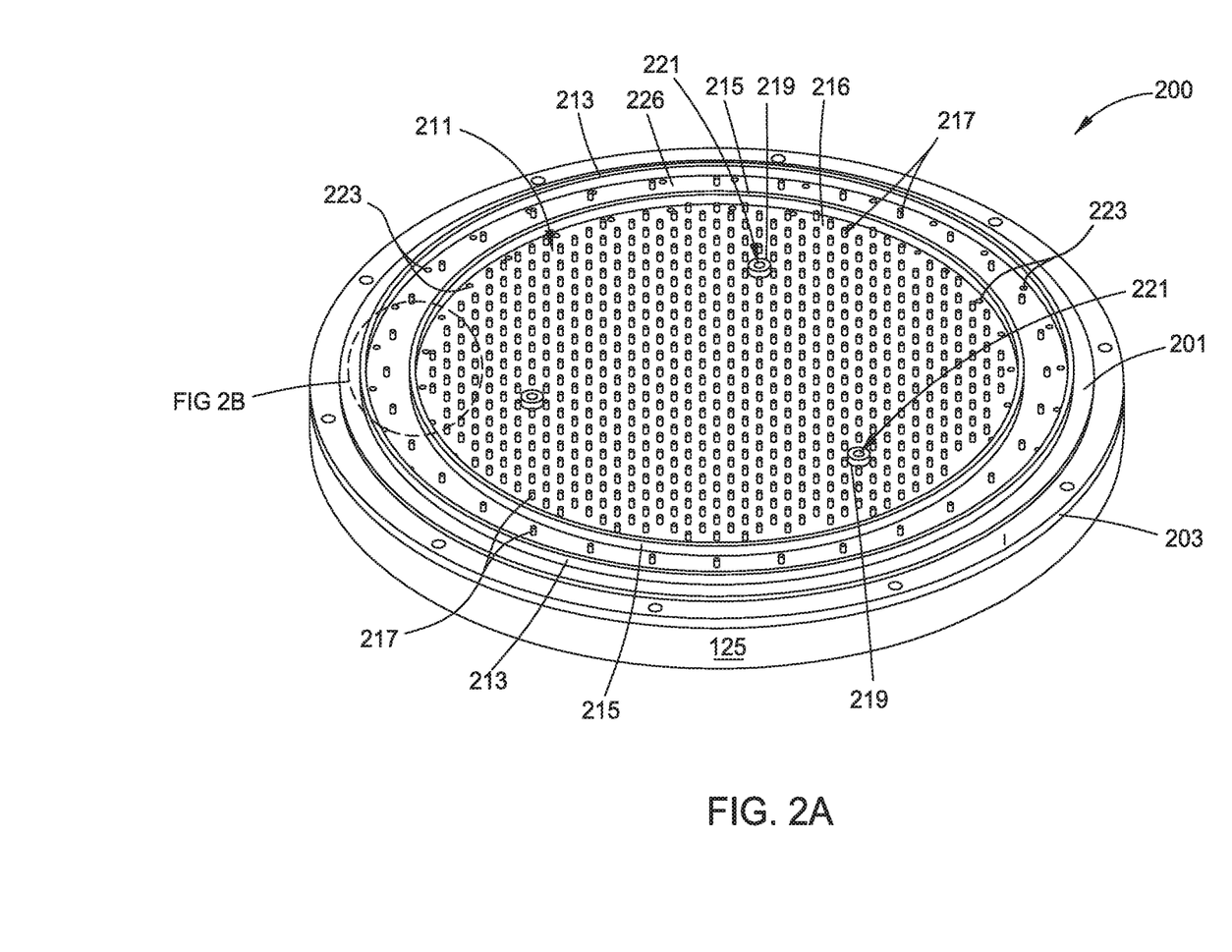
FIG. 2A is a schematic isometric view of a substrate support assembly, formed according to embodiments described herein.
Figure 2B:
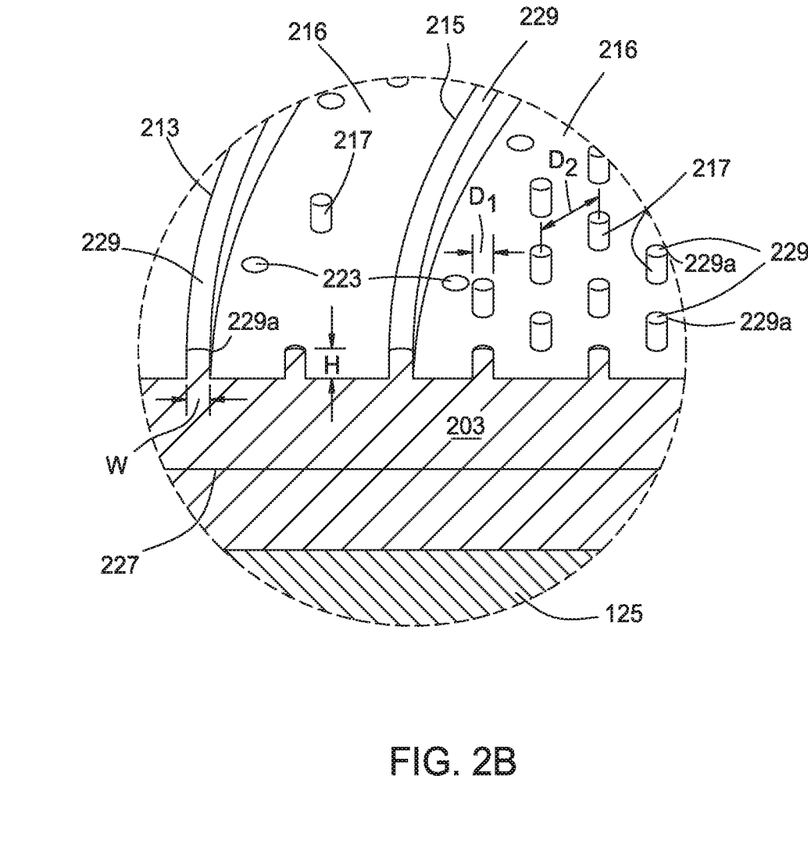
FIG. 2B is a close up isometric sectional view of a portion of the substrate support assembly shown in FIG. 2A.

FIG. 2A is a schematic isometric view of a substrate support assembly 200, formed according to embodiments described herein. FIG. 2B is a close-up isometric sectional view of a portion of the substrate support assembly 200 shown in FIG. 2A. Herein, the substrate support 203 includes a patterned surface 201 having a plurality of elevated features extending from one or more recessed surfaces 216. The elevated features herein include a plurality of protrusions 217, one or more outer sealing bands, such as a second outer sealing band 215 and a first outer sealing band 213, and a plurality of inner sealing bands 219. Herein, the first outer sealing band 213 is concentrically disposed about the center of the patterned surface 201 and proximate to an outer circumference thereof and the second outer sealing band 215 is concentrically disposed about the center of the patterned surface 201 proximate to, and radially inward of, the first outer sealing band 213. Each of the inner sealing bands 219 are coaxially disposed about respective lift pin openings 221 formed in the dielectric material of the substrate support 203. The elevated features and one or more recessed surfaces 216, and the non-device side surface of the substrate 115, define the boundary surfaces of the backside volume 117 (shown in FIG. 1) when the substrate 115 is chucked to the substrate support 203.

Typically, the patterned surface 201 is formed using a photolithography and bead blasting process where a pattern is exposed onto a photoresist coating disposed on the dielectric surface of the substrate support 203. The photoresist is then exposed to electromagnetic or thermal radiation to harden the exposed pattern into the photoresist where the hardened photoresist provides protection to the substrate support 203 surfaces therebeneath. The unexposed photoresist is removed and the one or more recessed surfaces 216 are formed by bead blasting the unprotected dielectric material of the substrate support 203 until a plurality of elevated features extend therefrom by a desired first height (not shown). Forming the patterned surface 201 using the method described above results in undesirable sharp edges of the substrate contacting surfaces 229 of the plurality of elevated features and results in an increased surface roughness of the dielectric material of the one or more recessed surfaces 216 formed therebetween. Sharp edges, as opposed to rounded edges, on the substrate contacting surfaces 229 of the elevated features contribute more to the number and severity of undesirable scratches on the non-device side surface of substrate during chucking and de-chucking thereof and are more disposed to undesirable wear of the dielectric material of the substrate support 203. The rough bead blasted surface of the one or more recessed surfaces 216 undesirably traps particulates that might otherwise be removed through the vacuum outlet 113 of the processing chamber 100 between unloading of the substrate 115 and loading of a new substrate 115. The trapped particulates may then undesirably transfer to the non-device side surface of the substrate 115 once it is chucked to the substrate support 203. Therefore, the patterned surface 201 is polished, according to the methods described herein, to round the edges of the elevated features and to polish and smooth the non-substrate contacting surfaces of the patterned surface 201 such that the elevated features extend from the recessed surface 216 by a desired second height H.

As shown in FIG. 2B, the plurality of protrusions 217 herein include a plurality of substantially cylindrical shaped mesas having a mean diameter $D_1$ of between about 500 µm and about 5 mm, a center to center (CTC) spacing $D_2$ of between about 5 mm and about 20 mm, and the height H of between about 3 µm and about 700 µm, such as between about 3 µm and about 100 µm, such as between about 3 µm and about 50 µm, such as between about 3 µm and 20 µm, or more than about 3 µm. One or more outer sealing bands include at least a first outer sealing band 213 concentrically disposed on the substrate support 203 and proximate to the outer circumference thereof. In some embodiments, the one or more major sealing bands includes an second outer sealing band 215 concentrically disposed on the substrate support 203 radially inward of, and proximate to, the first outer sealing band 213. The first outer and second outer sealing bands 213 and 215 typically have a substantially rectangular cross sectional profile, with a height H and a width between about 500 µm and about 5 mm. The plurality of inner sealing bands 219, one of each surrounding each lift pin opening, typically have a substantially rectangular shaped cross sectional profile, between an inner diameter and an outer diameter thereof with the height H and the width W. The plurality of protrusions 217, at least, hold the substrate 115 spaced from the recessed surface 216 when the substrate 115 is chucked to the substrate support 203, which allows the thermally conductive inert gas, herein helium, to flow from the gas inlet throughout the backside volume 117 between the substrate 115 and the substrate support 203. The sealing bands 213, 215, and 219 prevent, or significantly curtail, gas from flowing from the backside volume 117 into the processing volume 120 of the processing chamber 100 when the substrate 115 is chucked to the substrate support 203 (shown in FIG. 1). The substantially cylindrical shape of the plurality of protrusions 217 and the substantially rectangular cross sectional shapes of the sealing bands 213, 215, and 219 include shapes having rounded edges 229a formed according to the methods described herein. In other embodiments, the plurality of protrusions 217 comprise any other suitable shape such as square or rectangular blocks, cones, wedges, pyramids, posts, cylindrical mounds, or other protrusions of varying sizes, or combinations thereof that extend beyond the recessed surface 216 to support the substrate 115 and are formed using any suitable method.

In some embodiments, the contact area between the between the substrate contact surfaces 229 of the substrate support 203 and the non-device side surface of a substrate disposed thereon is less than about 30%, such as less than about 20%, such as less than about 15%, less than about 10%, less than about 5%, for example less than about 3%. Reducing the contact area between the non-device side surface of the substrate 115 and the patterned surface 201 has the desirable effect of reducing the non-device side substrate surface exposed to conditions which can cause scratching, such as during chucking and de-chucking of the substrate 115 due to physical contact therebetween. However, reducing the contact area between the non-device side surface of the substrate 115 and the patterned surface 201 increases the contact force therebetween at the substrate contact surfaces 229 thereof under the same, or substantially same, chucking force conditions. The increased contact force results in undesirable deeper scratches in the non-device side surface of the substrate 115 and/or undesirable increased wear of the substrate contacting surfaces 229 of the substrate support 203 than a substrate support configured for higher contact area. In particular, for reasons discussed above, the increased contact force results in undesirably deeper scratches on the non-device side surface of the substrate 115 and/or increased wear of the substrate contacting surfaces 229 at the edges of the interfaces thereof.

Further, particulates generated from the scratches and/or wear that become trapped in the rough bead blasted non-substrate contacting surfaces of the substrate support 203 may be subsequently transferred from the substrate support 203 to a substrate later disposed thereon. Further, a rough bead blasted surface of the dielectric material of substrate support 203 increases the susceptibility thereof to physical and chemical corrosion, and also increases the difficulty in cleaning the substrate support 203 to remove particles trapped thereon. Therefore, a method of rounding the edges 229a of the substrate contacting surfaces 229 and polishing the non-substrate contacting surfaces of the substrate support is outlined in FIG. 3A.

Figure 3A:
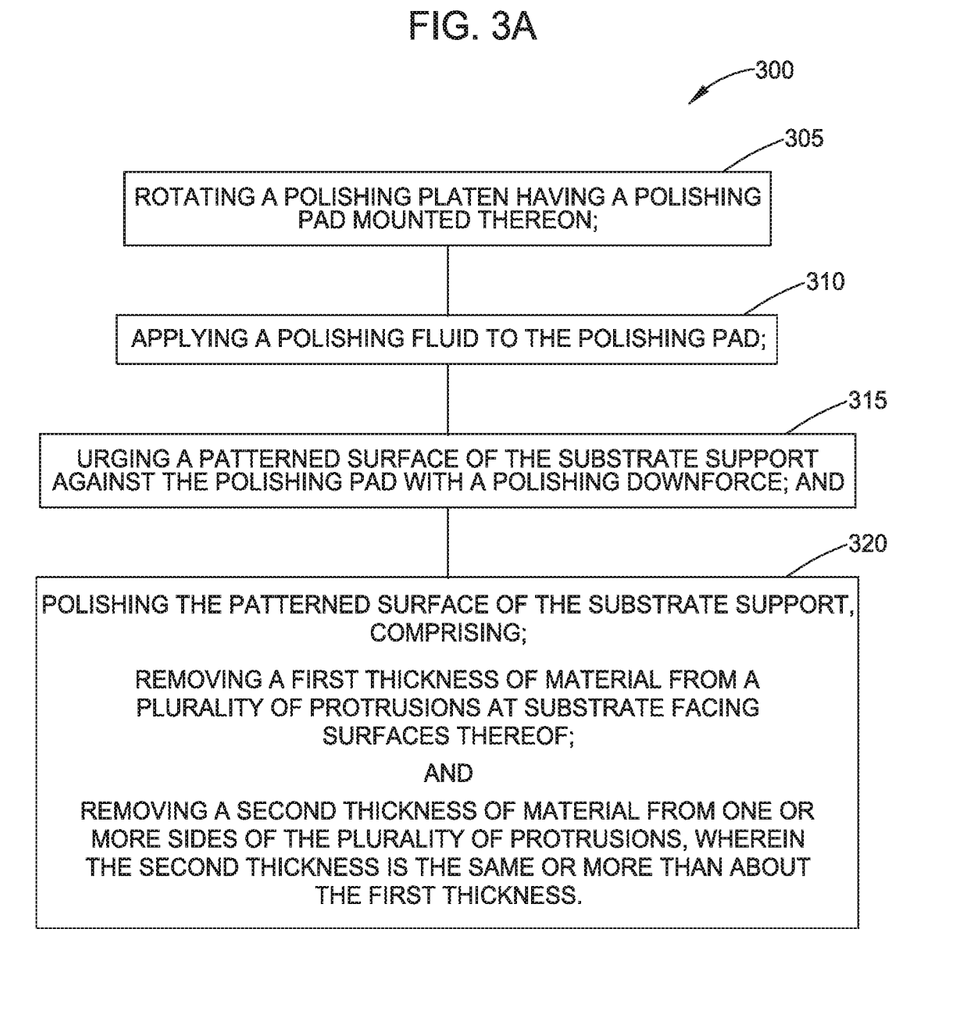
FIG. 3A is a flow diagram of a method of polishing a patterned surface of a substrate support, according to one embodiment.
Figure 3B:
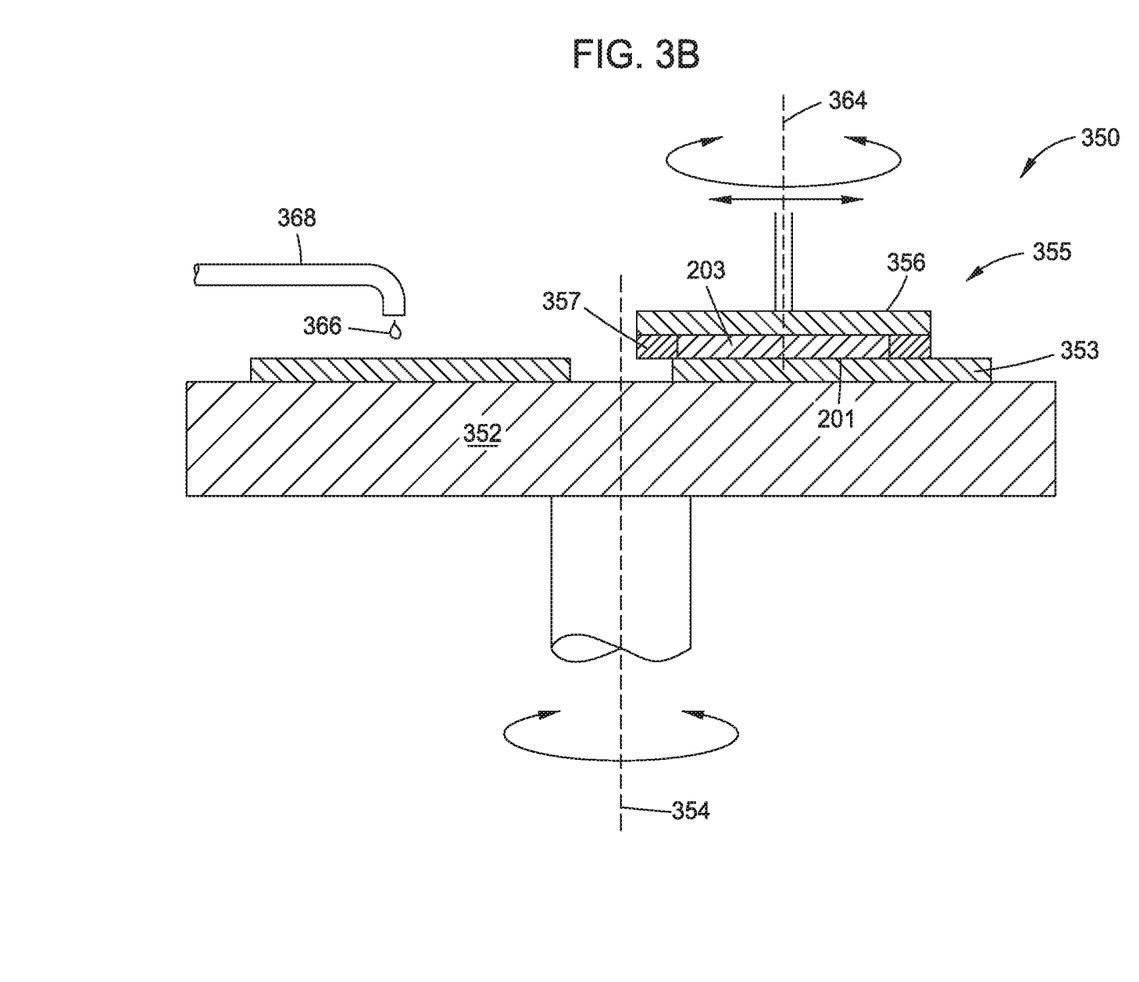
FIG. 3B is a schematic sectional view of an example of a polishing system 350 used to practice the method described in FIG. 3A.

FIG. 3A is a flow diagram of a method of polishing a patterned surface of a substrate support, according to one embodiment. FIG. 3B is a schematic sectional view of an example of a polishing system 350 used to practice the method described in FIG. 3A. In one embodiment the polishing system is one of the HYPREZ® lapping and polishing systems available from Engis Corp. of Wheeling, Ill. The polishing system 350 herein includes a platen 352 having a polishing pad 353 disposed thereon and a carrier 355 facing the platen 352 and the polishing pad 353. The carrier 355 includes a backing plate 356 for exerting a force on the substrate support 203 to urge the patterned surface 201 thereof against the polishing surface of the polishing pad 353. In some embodiments, the carrier 355 further includes a carrier ring 357, such as a ceramic carrier ring, disposed about the substrate support 203. Typically, the carrier 355 and/or the polishing system 350 is configured to exert a separate downforce on the carrier ring 357. Herein, the platen 352 has a diameter that is more than a diameter of the to be polished substrate support 203, such as more than the diameter of a substrate support configured to support a 200 mm diameter substrate, or more than the diameter of a substrate support configured to support a 300 mm diameter substrate, or more than about 200 mm in diameter, or more than about 300 mm, more than about 400 mm, more than about 500 mm, more than about 600 mm, for example more than about 700 mm.

At activity 305 the method 300 includes rotating a polishing platen, such as platen 352 shown in FIG. 3B, having a polishing pad 353 mounted thereon. Typically, the polishing pad 353 is a soft polishing pad having a high porosity or nap length so that the patterned surface 201 is not undesirably planarized during the method 300. In one embodiment, the polishing pad comprises a high nap poromeric polyurethane pad material having a hardness of less than about 70 shore A, such as less than about 60 shore A. In some embodiments the poromeric polyurethane pad material has a pore volume (% volume of open pores) of more than about 50%, such as more than about 60%. In some embodiments, the polishing pad comprises a polyurethane impregnated felt material, having a hardness of a durometer of less than about 70 shore D, such as less than about 60 shore D or less than about 80 asker C, for example less than 70 asker C. In some embodiments, the polishing surface of the polishing pad 353 has a nap length between about 300 µm and about 1 mm, such as more than about 300 µm, more than about 400 µm, for example between about 400 µm and about 1 mm. In some embodiments, the polishing pad 353 has an annular shape and at least a portion of the carrier 355 and/or the substrate support 203 disposed therein overlaps the inner diameter of the annular shape during polishing to control a material removal rate at the edges of the patterned surface 201 during the polishing thereof. Herein, the rotation speed of the polishing platen 352 is between about 10 rpm and about 90 rpm, such as between about 20 rpm and about 75 rpm.

At activity 310 the method 300 further includes applying a polishing fluid 366 to the polishing pad 353. As shown in FIG. 3B the polishing system 350 includes a polishing fluid dispenser 368 positioned over the platen 352 for delivering a polishing fluid 366 to the polishing surface of the polishing pad 353. Typically, the polishing fluid comprises a diamond abrasive dispersed in a water soluble carrier fluid. Herein, the diamond abrasives have an average diameter of less than about 10 μm, such as less than about 5 μm, for example between 50 nm and 5 μm, such as between about 100 nm and about 3 μm, or between about 500 nm and about 2 μm, for example about 1 μm.

At activity 315 the method 300 further includes urging the patterned surface 201 of the substrate support 203 against the polishing pad 353 with a polishing downforce. The carrier 355 shown in FIG. 3B is configured to exert a first downforce on the backing plate 356 having the substrate support 203 disposed therebeneath while rotating in a first direction about a first axis 364 and thereby urge the patterned surface 201 against the polishing pad 353. Herein, the carrier 355 is further configured to exert a second downforce on the carrier ring 357 to urge the carrier ring 357 against the polishing pad 353. Typically, the platen 352 and the polishing pad 353 disposed thereon are rotated in a second direction opposite the first direction about a second axis 354. In some embodiments, the rotating carrier 355 and the substrate support 203 disposed therein sweep back and forth from an inner diameter of the polishing pad 353 to an outer diameter of the polishing pad 353. In one embodiment, the carrier 355 and the substrate support 203 is rotated at a speed between 20 and 50 rpm, the first downforce on the backing plate 356 and the substrate support 203 disposed therebeneath is between about 0 lbs and about 50 lbs, and the second downforce on the carrier ring 357 is between about 25 lbs and about 50 lbs. The downforces herein are for polishing a substrate support 203 configured to support a 300 mm substrate. Appropriate scaling should be used for polishing substrate supports configured to support different sized substrates.

At activity 320 the method 300 further includes polishing the patterned surface of the substrate support. In embodiments herein, polishing the patterned surface 201 of the substrate support 203 includes removing a first thickness of dielectric material from the surfaces of the elevated features and desirably rounding the corners thereof, removing a second thickness of dielectric material from the sides of the elevated features, and removing a third thickness of dielectric material from the one or more recessed surfaces and desirably reducing the surface roughness thereof. Herein, the first thickness of dielectric material removed from the surfaces of the elevated features at activity 320 is between about 0.5 μm and about 4 μm, such as more than about 0.5 μm, such as more than about 0.75 μm, for example more than about 1 μm, or between about 1 μm and about 4 μm. The second thickness of material removed from the sides of the elevated features is between about 0.5 μm and about 10 μm, such as more than about 0.5 μm, for example more than about 1 μm. The third thickness of dielectric material removed from the one or more recessed surfaces is between about 0.1 μm and about 4 μm, such as more than about 0.1 μm. Typically, the surface roughness of the one or more recessed surfaces is resultantly reduced from a range of between about 0.4 μm Ra and about 0.8 μm Ra to a range between about 0.05 μm Ra and about 0.2 μm Ra, or less than about 0.2 μm Ra. Typically, the patterned surface is polished using the method 300 for between about 10 minutes and about 1 hour, such as between about 15 minutes and 45 minutes, or more than 10 minutes.

Figure 4A:
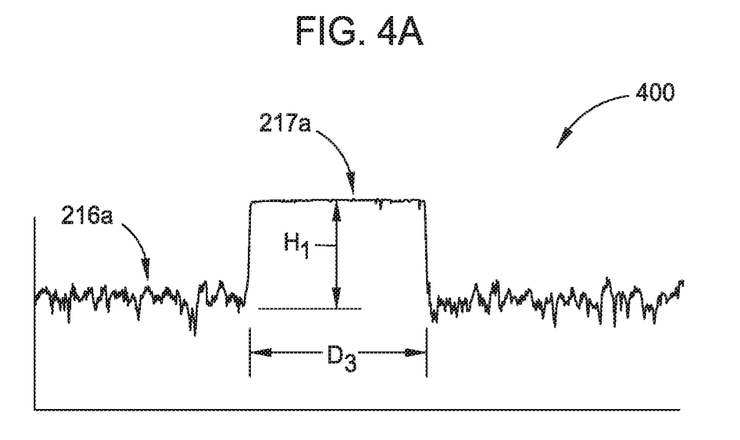
FIG. 4A shows the surface roughness profile 400 of a portion of a patterned surface of a substrate support formed using a photolithography/bead blasting process.
Figure 4B:
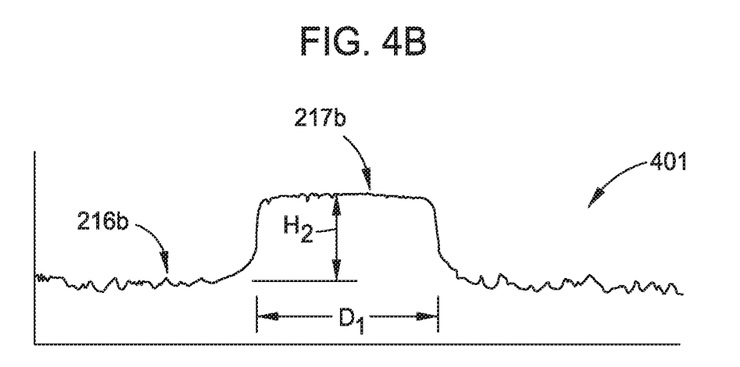
FIG. 4B shows the surface roughness profile 401 of the same portion of the patterned surface shown in FIG. 4A after polishing according to the methods described herein.

FIG. 4A shows a profile 400 of the surface roughness of a portion of a patterned surface of a substrate support formed using a photolithography/bead blasting process. FIG. 4B shows a profile 401 of the surface roughness of the same portion of the patterned surface after polishing according to the methods described herein. In FIGS. 4A-4B about 1 μm of material was removed from the upper surface of a cylindrical protrusion 217 to reduce the height of the pre-polished protrusion 217a from a first height $H_1$ of about 14 μm before polishing about 30 min to a second height $H_2$ of the post-polish protrusion 217b of about 13 μm and to round the edges at the substrate contacting surface thereof. Herein, the diameter $D_3$ of the pre-polish protrusion 217a was about 30 μm and the diameter $D_1$ of the post-polish protrusion 217b is about 25 μm indicating that the thickness of the material removed from the side walls of the protrusion is about 2.5 μm or that the thickness of the material removed from the side walls of an elevated feature using the methods described herein is at least equal to or more than the thickness of the material removed from the substrate contacting surface of the elevated feature. FIGS. 4A-4B further show a desirable smoothing of the rough bead blasted recessed surface pre-polish 216a to a smoother recessed surface post-polish 216b.

While the foregoing is directed to embodiments of the present disclosure, other and further embodiments of the disclosure may be devised without departing from the basic scope thereof, and the scope thereof is determined by the claims that follow.

The invention claimed is:

1. A method of polishing a substrate support, comprising:
   rotating a polishing platen having a polishing pad mounted thereon;
   applying a polishing fluid to the polishing pad;
   urging a patterned surface of the substrate support against the polishing pad with a polishing downforce, wherein the patterned surface of the substrate support comprises a plurality of protrusions extending from one or more recessed surfaces, and wherein a substrate contacting surface area of the patterned surface is less than about 20% of a non-device side surface area of a substrate to be disposed on the substrate support; and
   polishing the patterned surface of the substrate support, comprising:
   removing a first thickness of material from a plurality of protrusions at substrate facing surfaces thereof; and
   removing a second thickness of material from one or more sides of the plurality of protrusions, wherein the second thickness is about the same or more than the first thickness.

2. The method of claim 1, wherein each of the plurality of protrusions have a height of between about 3 μm and about 50 μm.

3. The method of claim 2, wherein the patterned surface of the substrate support is formed of a dielectric material.

4. The method of claim 3, wherein the plurality of protrusions have a mean diameter between about 500 μm and about 5 mm.

5. The method of claim 4, wherein polishing the patterned surface includes smoothing one or more recessed surfaces thereof to a surface roughness less than about 0.2 μm Ra.

6. The method of claim 4, wherein a substrate contacting surface area of the patterned surface is less than about 10% of a non-device side surface area of a substrate to be disposed on the substrate support.

7. The method of claim 4, wherein the patterned surface further comprises a plurality of inner sealing bands, each one coaxially disposed about an opening formed in the dielectric material of the substrate support.

8. The method of claim 7, wherein the patterned surface of the substrate support is formed by bead blasting a surface of the dielectric material thereof.

9. The method of claim 3, wherein the dielectric material is selected from the group consisting of aluminum oxide ($Al_2O_3$), aluminum nitride (AlN), titanium oxide (TiO), titanium nitride (TiN), yttrium oxide ($Y_2O_3$), and combinations thereof.

10. The method of claim 9, wherein the first thickness is between about 0.5 μm and about 4 μm.

11. The method of claim 3, wherein the patterned surface of the substrate support further comprises one or more outer sealing bands concentrically disposed on the substrate support and at least one of the one or more outer sealing bands is proximate to an outer circumference of the patterned surface.

12. The method of claim 1, wherein the polishing pad comprises a urethane impregnated felt material having a nap length of more than about 300 μm.

13. The method of claim 1, wherein the polishing pad has a pore volume of more than about 50%.

14. A method of polishing a patterned surface of a substrate support, comprising:
  rotating a polishing platen having a polishing pad mounted thereon;
  applying a polishing fluid to the polishing pad, the polishing fluid comprising diamond abrasives having an average diameter of less than about 10 μm;
  urging the patterned surface of the substrate support against the polishing pad with a polishing downforce, wherein:
    the patterned surface of the substrate support comprises a plurality of elevated features extending from one or more recessed surfaces,
    a surface area of the plurality of elevated features defining a substrate contacting surface is less than about 20% of a non-device side surface area of a substrate to be disposed on the substrate support,
    the patterned surface is formed of a dielectric material selected from the group consisting of aluminum oxide (Al2O3), aluminum nitride (AlN), titanium oxide (TiO), titanium nitride (TiN), yttrium oxide (Y2O3), and combinations thereof,
    the plurality of elevated features further comprises a plurality of inner sealing bands, one of each of the inner sealing bands coaxially disposed about an opening formed in the dielectric material of the substrate support; and
  polishing the patterned surface of the substrate support to remove more than about 0.5 μm of material from the substrate contacting surfaces of the elevated features.

15. A method of polishing a patterned surface of a substrate support, comprising:
  rotating a polishing platen having a polishing pad mounted thereon;
  applying a polishing fluid to the polishing pad, the polishing fluid comprising diamond abrasives having an average diameter of less than about 10 μm;
  urging the patterned surface of the substrate support against the polishing pad with a polishing downforce, wherein the patterned surface of the substrate support comprises a plurality of elevated features extending from one or more recessed surfaces thereof, and wherein a surface area of the plurality of elevated features defining a substrate contacting surface is formed is less than about 20% of a non-device side surface area of a substrate to be disposed on the substrate support; and
  polishing the patterned surface of the substrate support to remove more than about 0.5 μm of material from the substrate contacting surfaces of the elevated features, wherein the plurality of elevated features comprise a plurality of protrusions having a mean diameter between about 500 μm and about 5 mm and one or more outer sealing bands concentrically disposed on the substrate support, wherein at least one of the one or more outer sealing bands is proximate to an outer circumference of the patterned surface, and wherein polishing the patterned surface of the substrate support further comprises removing more than about 0.5 μm of material form the sides of the elevated features.

16. The method of claim 15, wherein polishing the patterned surface includes smoothing the one or more recessed surfaces thereof to a roughness less than about 0.2 μm Ra.

17. A method of polishing a patterned surface of a substrate support, comprising:
  rotating a polishing platen having a polishing pad mounted thereon;
  applying a polishing fluid to the polishing pad, the polishing fluid comprising diamond abrasives having an average diameter of less than about 10 μm;
  urging the patterned surface of the substrate support against the polishing pad with a polishing downforce, wherein the patterned surface of the substrate support comprises a plurality of cylindrical protrusions extending from one or more recessed surfaces thereof,
  wherein a surface area of the substrate contacting areas of the plurality of cylindrical protrusions is less than about 20% of a non-device side surface area of a substrate to be disposed on the substrate support,
  wherein the plurality of cylindrical protrusions have a mean diameter of between 500 μm and about 5 mm,
  and wherein the patterned surface is formed of a dielectric material selected from the group consisting of aluminum oxide ($Al_2O_3$), aluminum nitride (AlN), titanium oxide (TiO), titanium nitride (TiN), yttrium oxide ($Y_2O_3$), and combinations thereof; and
  polishing the patterned surface of the substrate support to remove more than about 0.5 μm of dielectric material from the surfaces of the plurality of cylindrical protrusions to form the substrate contacting surfaces and more than about 0.1 μm of dielectric material from the one or more recessed surfaces.

* * * * *